United States Patent [19]

Yamazaki et al.

[11] Patent Number: 5,223,063
[45] Date of Patent: Jun. 29, 1993

[54] METHOD FOR BONDING SEMICONDUCTOR ELEMENTS TO A TAB TAPE

[75] Inventors: Nobuto Yamazaki; Akihiro Nishimura, both of Tokyo, Japan

[73] Assignee: Kabushiki Kaisha Shinkawa, Tokyo, Japan

[21] Appl. No.: 900,524

[22] Filed: Jun. 17, 1992

Related U.S. Application Data

[63] Continuation of Ser. No. 510,040, Apr. 16, 1990, abandoned.

[30] Foreign Application Priority Data

Apr. 17, 1989 [JP] Japan .................... 1-96948

[51] Int. Cl.$^5$ .................... B32B 31/16; H05K 3/34
[52] U.S. Cl. .................... 156/73.2; 156/73.1;
264/23; 29/827; 29/840; 228/110; 228/179
[58] Field of Search .................... 156/73.1, 73.2, 580.1;
228/1.1, 4.5, 110, 111, 179; 264/23; 29/827, 840

[56] References Cited

U.S. PATENT DOCUMENTS

| | | | |
|---|---|---|---|
| 3,698,985 | 10/1972 | Robinson | 228/1.1 |
| 4,759,073 | 7/1988 | Shah et al. | 228/179 X |
| 4,958,762 | 9/1990 | Shimizu et al. | 228/1.1 |

FOREIGN PATENT DOCUMENTS 0058845  2/1990  Japan ..................... 228/1.1

Primary Examiner—David A. Simmons
Assistant Examiner—J. Sells
Attorney, Agent, or Firm—Koda and Androlia

[57] ABSTRACT

Method for bonding inner leads installed on a tab tape, which is fed in one direction in a bonding line, to electrodes of semiconductor elements via ultrasonic vibrations applied to a bonding tool mounted at one end of horn is performed in such a manner that the direction in which the ultrasonic vibrations are applied to the bonding tool is in the range of 30 to 60 degrees, preferably 45 degrees, with respect to the direction in which the tab tape is fed so that the bonding tool oscillates in such angles.

4 Claims, 2 Drawing Sheets

METHOD FOR BONDING SEMICONDUCTOR ELEMENTS TO A TAB TAPE

This is a continuation of application Ser. No. 510,040, filed Apr. 16, 1990 now abandoned.

BACKGROUND OF THE INVENTION

1. Field of the Invention

The present invention relates to a method for individually bonding inner leads installed on a tab tape to electrodes of semiconductor elements using a bonding tool.

2. Prior Art

As shown in FIG. 3(a), inner leads (2a, 2b, 2c, 2d) installed on a tab tape 1 project inward from the four sides of a square opening 10 in the tab tape 1 oriented in the X and Y directions such that the inner leads on the four sides are perpendicular to each other. In a known method, the inner leads 2a through 2d of the tab tape 1 are individually bonded to the electrodes 3a of a semiconductor element 3 by applying ultrasonic waves to a bonding tool 4 as seen in FIG. 3(b).

The direction of the ultrasonic vibrations of the horn 5 having the bonding tool 4 in the axial direction of the horn 5. Accordingly, the horn 5 is rotated the axial direction thereof matches the direction in which the inner leads (2a through 2d) project as shown by dotted lines in FIG. 3(a) in order to secure that the ultrasonic waves are evenly applied to the inner leads (2a through 2d).

More specifically, first any positional discrepancy between the inner leads (2a through 2d) and the electrodes 3a is detected by a detection means (not shown), and the positions of the inner leads and electrodes are adjusted to be matched.

The axial directional of the horn 5 is set to coincide with the direction of inner lead 2a-1 (i.e., the Y direction) at the left end of the inner leads 2a. The bonding tool 4 is lowered so that inner lead 2a-1 is pressed against the electrode 3a, and ultrasonic vibrations are applied to the horn 5 so that the inner lead 2a-1 and electrode 3a are bonded.

Next, the bonding tool 4 rises and is moved in the X direction so that the tool 4 is positioned over the next inner lead 2a-2. Then, the inner lead 2a-2 and another electrode 3a are bonded by the same operation as that described above.

When bonding of all of the inner leads 2a is completed, the bonding head (not shown) which holds the horn 5 is rotated 90 degrees so that the axial direction of the horn 5 is coincides with the direction of the inner leads 2b, and the inner leads 2b are bonded in the same manner as the inner leads 2a.

When the bonding of the inner leads 2b is completed, the bonding head is again rotated 90 degrees in order to bond the inner leads 2c, and the bonding of the inner leads 2c is performed. When the bonding of the inner leads 2c is completed, the bonding head is rotates 90 degrees, and the bonding of the inner leads 2d is performed. When the bonding of the inner leads 2d is completed, the bonding head is again rotated 90 degrees so that the bonding tool 4 is returned to the starting position.

Thus, in prior art bonding apparatus, the bonding head must be rotated four times (90 degrees each time) to complete one device.

Thus, since it is necessary to rotate the bonding head four times for each device, considerable time is wasted, and the conventional technique is inferior in terms of productivity. In addition, a rotating mechanism for rotating the bonding head is required. As a result, the bonding head section is complicated, and the over all cost of the apparatus tends to increase.

SUMMARY OF THE INVENTION

Accordingly, the object of the present invention is to provide a method for bonding inner leads of the tab tape to semiconductor elements which provides an improved productivity and a simplified structure of the bonding head part.

The above object is accomplished by bonding inner leads and electrodes with the direction in which ultrasonic vibrations are applied to the bonding tool oriented in the rage between 30 and 60 degrees with respect to the direction of movement (feeding movement) of the tab tape.

In the resent invention, since bonding is performed by applying ultrasonic vibrations to bonding tool with an orientation in the range of 30 to 60 degrees with respect to all of the inner leads projecting inwardly (in perpendicular directions) from the four sides of each opening in the tab tape, inner leads can be bonded to electrodes without rotating the bonding tool, that is, the bonding head.

DETAILED DESCRIPTION OF THE INVENTION

Figure 1:
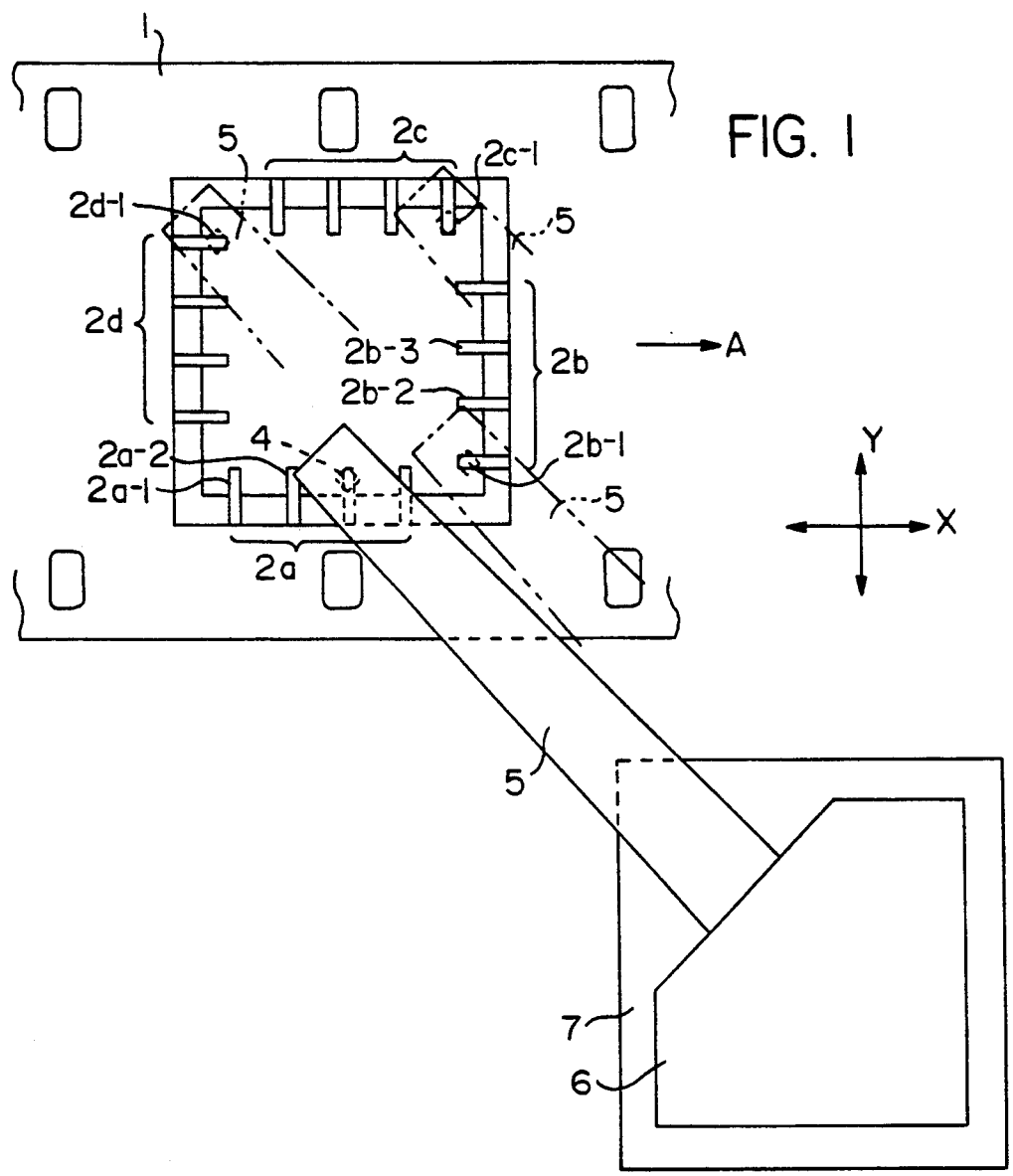
FIG. 1 is a plan view which illustrates the embodiment of the present invention.

One embodiment of the present invention will be described with reference to FIGS. 1 and 2. Elements the same as (or corresponding to) those in FIG. 3 are labeled with the same reference numerals or symbols, and a description of such elements will be omitted.

As shown in FIG. 1, the axial direction of the horn 5 is oriented at 45 degrees with respect to the direction of movement A of the tab tape 1 (X direction in this embodiment). The bonding head 6 which holds the horn 5 so as to freely move the horn 5 upward and downward is mounted on an X-Y table 7.

When the bonding operation begins with inner lead 2a-1 of the inner leads 2a, first, the bonding tool 4 is lowered so that the inner lead 2a-1 is pressed against the corresponding electrode (not shown here), and ultrasonic vibrations are applied to the horn 5, so that inner lead 2a-1 is bonded to the electrode.

Afterward, the bonding tool 4 is raised and moved in the X direction so that the bonding tool 4 is positioned over the inner lead 2a-2. Then, the inner lead 2a-2 is bonded to the electrode below the inner lead 2a-2 by the same operation.

When the bonding of all of the inner leads 2a is completed, the bonding head 6 is driven in the X-Y directions so that the bonding tool 4 is positioned over the inner lead 2b-1 of the inner leads 2b. Then, the inner leads 2b are bonded by the same operation as performed on the inner leads 2a. In this case, the movement of the bonding tool 4 is in the Y direction only, i.e., from the inner lead 2b-1 to the inner lead 2b-2, 2b-3, and so on.

When the bonding of the inner leads 2b is completed, the bonding head 6 is driven in the X-Y directions so that the bonding tool 4 is positioned over the inner lead 2c-1 at the right end of the inner leads 2c and the inner leads 2c are bonded. In this bonding operation, the bonding tool 4 is moved in the X direction.

When the bonding of the inner leads 2c is completed, the bonding head 6 is driven in the X-Y directions so that the bonding tool 4 is positioned over inner lead 2d-1 at the upper end of the inner leads 2d, and the inner leads 2d are bonded as the bonding tool 4 is moved in the Y direction.

When the bonding of the inner leads 2d is completed, the bonding head 6 is driven in the X-Y directions so that the bonding tool 4 is returned to the starting position.

Since the axial direction of the horn 5 is thus oriented at 45 degrees with respect to the direction of movement of the tab tape 1, the horn 5, i.e., the bonding tool 4, is positioned at the same angle with respect to the directions of extension of all inner leads (2a through 2d). In addition, when the inner leads 2a through 2d are bonded to corresponding electrodes, the direction in which ultrasonic vibrations are applied to the bonding tool 4 is the same as the axial direction of the horn 5, and the bonding tool 4 is caused to reciprocate by ultrasonic vibrations in this direction. Accordingly, there is no difference in bonding effect between the inner leads 2a and inner leads 2c. The same is true of inner leads, 2b and 2d.

The relationship between the inner leads 2a and 2b with respect to the direction of reciprocation or vibration of the bonding tool 4 will be considered in more detail.

Figure 2A:
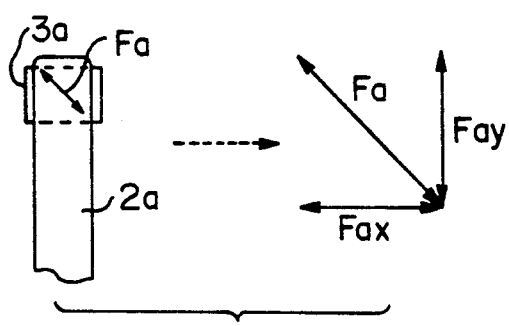
FIGS. 2(a) and 2(b) are explanatory diagrams showing the relationship between the inner leads and the ultrasonic vibrations.
Figure 2B:
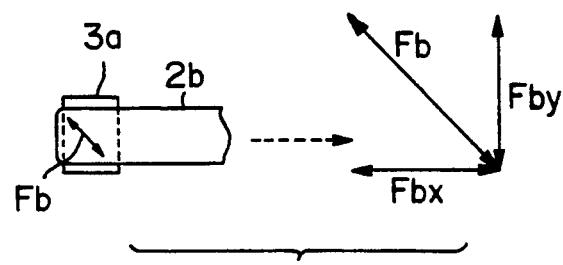
Figure 3A:
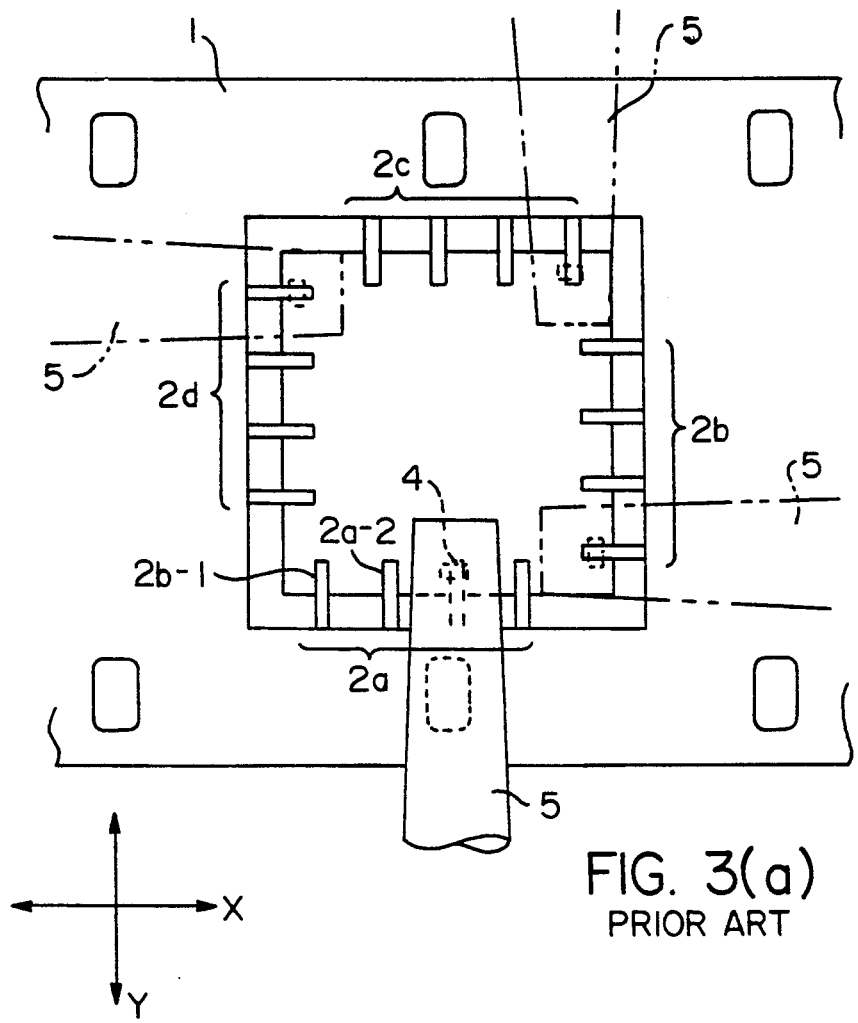
FIGS. 3(a) and 3(b) are a plan view and a front view, respectively, of a conventional method.
Figure 3B:
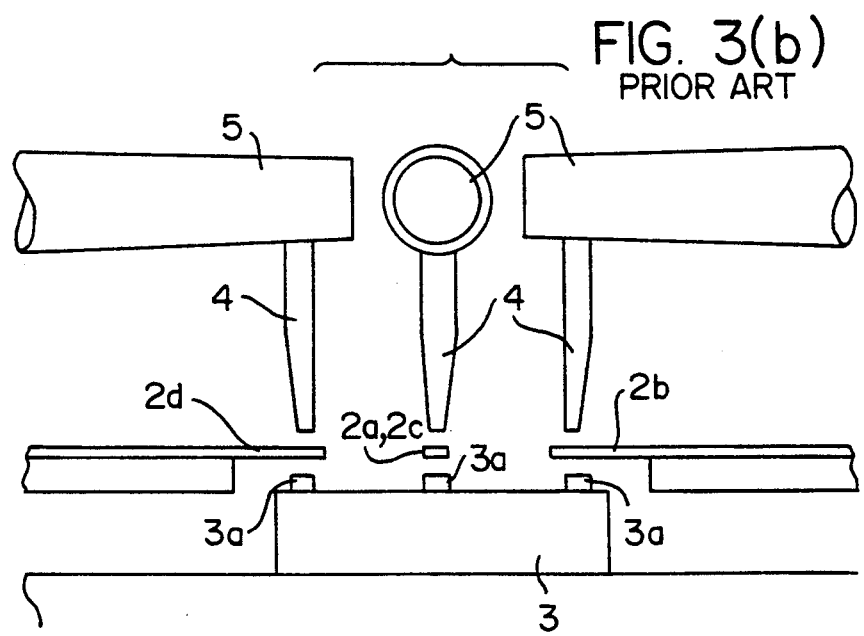

FIG. 2(a) illustrates the inner leads 2a, and FIG. 2(b) the inner leads 2b. The ultrasonic vibrations Fa applied to the inner leads 2a can be broken down as Fa=Fax+-Fay, while the ultrasonic vibrations Fb applied to the inner leads 2b can be broken down as Fb=Fbx+Fby. Since Fa and Fb are the same, Fax=Fbx, and Fay=Fby. Thus, the action components are the same for both the inner leads 2a and 2b. In other words, by positioning the horn 5 at an angle of 45 degrees and applying ultrasonic vibrations to the bonding tool 4, uniform bonding conditions can be obtained for all the inner leads 2a through 2d without rotating the horn 5.

The embodiment described above is the best mode of the present invention. As a result of experiments, however, it was found that there are no practical problems as long as the direction in which ultrasonic vibrations are applied to the bonding tool 4 is oriented in the range of 30 to 60 degrees with respect to the direction of movement of the tab tape 1.

As seen from the above, in the present invention, inner leads and electrodes are bonded with the direction in which ultrasonic vibrations are applied to the bonding tool oriented in the range of 30 to 60 degrees with respect to the direction of movement of tab tape. As a result, there is no need to rotate the bonding head, productivity is improved, and the bonding head section can be simplified.

We claim:

1. A method of bonding a plurality of inner leads of a tab tape to a plurality of electrodes of a semiconductor element in which said inner leads and electrodes are arranged continually in an X direction, in a Y direction which is perpendicular to said X direction, in another X direction which is perpendicular to said Y direction and opposite to said X direction, and in another Y direction which is perpendicular to said another X direction and opposite to said Y direction, characterized in that a bonding tool provided on a bonding horn, which is set to be aligned at an angle between 30 and 60 degrees with respect to a feeding direction of said tab tape, moves in said X direction to successively bond each of said plurality of inner leads arranged in said X direction to corresponding ones of said plurality of electrodes arranged in said X direction, moves in said Y direction to successively bond each of said plurality of inner leads arranged in said Y direction to corresponding ones of said plurality of electrodes arranged in said Y direction, moves in said another X direction to successively bond each of said plurality of inner leads arranged in said another X direction to corresponding ones of said plurality of electrodes arranged in said another X direction, and moves in said another Y direction to successively bond each of said plurality of inner leads arranged in said another Y direction to corresponding ones of said plurality of electrodes arranged in said another Y direction.

2. A method of bonding a semiconductor element to a tab tape according to claim 1, wherein said bonding hr on is aligned at an angle of 45 degrees relative to said feeding direction of said tab tape.

3. A method of bonding a plurality of inner leads of a tab tape to a plurality of electrodes of a semiconductor element in which said inner leads and electrodes are arranged continually in an X direction, in a Y direction which is perpendicular to said X direction, in another X direction which is perpendicular to said Y direction and opposite to said X direction, and in another Y direction which is perpendicular to said another X direction and opposite to said Y direction, characterized in that a bonding tool provided on a bonding horn, which is set to be aligned at an angle between 30 and 60 degrees with respect to a feeding direction of said tab tape and applied with ultrasonic vibrations, moves in said X direction to successively bond each of said plurality of inner leads arranged in said X direction to corresponding ones of said plurality of electrodes arranged in said X direction, moves in said Y direction to successively bond each of said plurality of inner leads arranged in said Y direction to corresponding ones of said plurality of electrodes arranged in said Y direction, moves in said another X direction to successively bond each of said plurality of inner leads arraigned in said another X direction to corresponding ones of said plurality of electrodes arranged in said another X direction, and moves in said another Y direction to successively bond each of said plurality of inner leads arranged in said another Y direction to corresponding ones of said plurality of electrodes arranged in said another Y direction.

4. A method of bonding a semiconductor element to a tab tape according to claim 3, wherein said bonding horn is aligned at an angle of 45 degrees relative to said feeding direction of said tab tape.

* * * * *